United States Patent
Lee et al.

(10) Patent No.: US 11,957,038 B2
(45) Date of Patent: Apr. 9, 2024

(54) MASK ASSEMBLY AND DEPOSITION APPARATUS INCLUDING THE SAME

(71) Applicant: Samsung Display Co., Ltd., Yongin-Si (KR)

(72) Inventors: Areum Lee, Suwon-si (KR); Jeongkuk Kim, Suwon-si (KR); Hwi Kim, Suwon-si (KR); Seungyong Song, Suwon-si (KR); Kyu Hwan Hwang, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 329 days.

(21) Appl. No.: 17/245,512

(22) Filed: Apr. 30, 2021

(65) Prior Publication Data
US 2022/0013725 A1    Jan. 13, 2022

(30) Foreign Application Priority Data

Jul. 10, 2020    (KR) .................... 10-2020-0085284

(51) Int. Cl.
| | | |
|---|---|---|
| C23C 14/04 | (2006.01) | |
| H10K 71/00 | (2023.01) | |
| H10K 71/16 | (2023.01) | |
| H10K 59/12 | (2023.01) | |

(52) U.S. Cl.
CPC ......... *H10K 71/166* (2023.02); *C23C 14/042* (2013.01); *H10K 71/00* (2023.02); *H10K 71/164* (2023.02); *H10K 59/12* (2023.02)

(58) Field of Classification Search
CPC ........ H10K 71/166; C30B 25/04; C23C 8/04; C23C 10/04; C23C 14/04; C23C 14/042; C23C 14/044; C23C 16/04; C23C 16/042; C23C 18/06
See application file for complete search history.

(56) References Cited

U.S. PATENT DOCUMENTS

| | | | |
|---|---|---|---|
| 10,428,415 B2 | 10/2019 | Park et al. | |
| 2007/0134567 A1* | 6/2007 | Park ...................... | C23C 14/042 |
| | | | 430/394 |
| 2013/0337588 A1* | 12/2013 | Lee ...................... | H10K 71/166 |
| | | | 438/22 |
| 2015/0068455 A1* | 3/2015 | Lee ...................... | B23K 26/382 |
| | | | 118/504 |

(Continued)

FOREIGN PATENT DOCUMENTS

| | | |
|---|---|---|
| CN | 106567052 A | 4/2017 |
| CN | 110783498 A | 2/2020 |

(Continued)

OTHER PUBLICATIONS

English translation of WO 2020009088, the original foreign reference was previously filed in the IDS (Year: 2020).*

(Continued)

*Primary Examiner* — Aiden Lee
(74) *Attorney, Agent, or Firm* — CANTOR COLBURN LLP (57) ABSTRACT

A mask includes a body unit through which a deposition opening is defined, and a protrusion unit through which a pattern opening is defined and which protrudes from a corner of the body unit, where a thickness of the body unit is greater than a thickness of the protrusion unit.

20 Claims, 11 Drawing Sheets

(56) References Cited

U.S. PATENT DOCUMENTS

| | | | |
|---|---|---|---|
| 2016/0083834 A1 | 3/2016 | Yamazaki et al. | |
| 2016/0322572 A1* | 11/2016 | Chen | B05C 21/005 |
| 2018/0040855 A1* | 2/2018 | Chen | H10K 71/00 |
| 2018/0053894 A1 | 2/2018 | Miyadera et al. | |
| 2019/0386221 A1 | 12/2019 | Jang et al. | |
| 2019/0390318 A1* | 12/2019 | Zhang | H10K 71/166 |
| 2020/0102636 A1 | 4/2020 | Lee et al. | |
| 2020/0144530 A1 | 5/2020 | Kim et al. | |

FOREIGN PATENT DOCUMENTS

| | | |
|---|---|---|
| KR | 101900281 B1 | 9/2018 |
| KR | 102000548 B1 | 7/2019 |
| WO | 2019228006 A1 | 12/2019 |
| WO | 2020009088 A1 | 1/2020 |

OTHER PUBLICATIONS

Partial European Search Report for Application No. 21184107.7-1103 dated Dec. 13, 2021.
Extended European Search Report for Application No. 21184107.7-1103 dated Apr. 8, 2022.

* cited by examiner

MASK ASSEMBLY AND DEPOSITION APPARATUS INCLUDING THE SAME

This application claims priority to Korean Patent Application No. 10-2020-0085284, filed on Jul. 10, 2020, and all the benefits accruing therefrom under 35 U.S.C. § 119, the content of which in its entirety is herein incorporated by reference.

BACKGROUND

1. Field

Embodiments of the invention relate to a mask and a deposition apparatus, and more particularly, to a mask of which a corner area is patterned, and a deposition apparatus including the same.

2. Description of the Related Art

Typically, a light emitting display device has a light emitting device arranged for each of pixels. The light emitting element includes a light emitting layer disposed between separated electrodes. The light emitting layers included in the pixels may be divided into a plurality of groups.

A mask is used for depositing the plurality of groups of the pixels on a working substrate. After arranging the working substrate on the mask, a deposition material may be deposited on the working substrate.

SUMMARY

Embodiments of the invention provide a deposition apparatus including a mask of which corner area is patterned.

An embodiment of the invention provides a mask including a body unit through which a deposition opening is defined, and a protrusion unit through which a pattern opening is defined and which protrudes from a corner of the body unit, where a thickness of the body unit is greater than a thickness of the protrusion unit.

In an embodiment, the protrusion unit may include a first part protruding from the corner of the body unit, a second part spaced apart from the first part and protruding from the corner of the body unit, and a third part disposed between the first part and the second part.

In an embodiment, the corner may have a curvature, and the third part may be concave from the deposition opening towards the corner of the body unit.

In an embodiment, the pattern opening may be provided in plural, where a plurality of pattern openings may be arranged from the corner of the body unit towards the deposition opening.

In an embodiment, the plurality of pattern openings may be surrounded by the protrusion unit.

In an embodiment, the plurality of pattern openings may have different areas from each other.

In an embodiment, the protrusion unit may include a plurality of partition walls, where the plurality of partition walls may expose a portion of the corner of the body unit, be arranged separately from each other, and extend from the corner of the body unit towards the deposition opening.

In an embodiment, the protrusion unit may be provided in plural, where, in a direction from the corner of the body unit towards the deposition opening, a width of at least one among the protrusion units may vary in a perpendicular direction to the direction.

In an embodiment, a thickness of the body unit may be about 100 micrometers ($\mu$m) to about 300 $\mu$m.

In an embodiment, a thickness of the protrusion unit may be about 10 $\mu$m to about 50 $\mu$m.

In an embodiment of the invention, a deposition apparatus includes a chamber, a mask arranged inside the chamber, a base substrate arranged on the mask, and including a first area adjacent to a corner and a second area surrounding at least a portion of the first area, and a deposition source which provides a deposition material to the base substrate, where the mask includes a body unit in which a deposition opening exposing the second area is defined, and a protrusion unit in which a pattern opening exposing a portion of the first area is defined and which protrudes from a corner of the body unit and covers a remaining portion of the first area, where a thickness of the body unit is greater than a thickness of the protrusion unit.

In an embodiment, the protrusion unit may include a first part protruding from the corner of the body unit, a second part spaced apart from the first part and protruding from the corner of the body unit, and a third part disposed between the first part and the second part.

In an embodiment, the corner of the body unit may have a curvature, and the third part may be concave from the deposition opening towards the corner of the body unit.

In an embodiment, the pattern opening may be provided in plural, where a plurality of pattern openings may be arranged from the corner of the body unit towards the deposition opening.

In an embodiment, the plurality of pattern openings may be surrounded by the protrusion unit.

In an embodiment, the plurality of pattern openings may have different areas from each other.

In an embodiment, the protrusion unit may include a plurality of partition walls, where the plurality of plurality of partition walls may expose a portion of the corner of the body unit, be arranged separately from each other, and extend from the corner of the body unit towards the deposition opening.

In an embodiment, the protrusion unit may be provided in plural, where, in a direction from the corner of the body unit towards the deposition opening, a width of at least one among the protrusion units may vary in a perpendicular direction to the direction.

In an embodiment, the base substrate may include a base layer, a circuit element layer arranged on the base layer and including a transistor including a plurality of electrodes, a display element layer including a first electrode connected to the transistor, a hole control layer arranged on the first electrode, a light emitting layer arranged on the hole control layer, an electron control layer arranged on the light emitting layer, and a second electrode arranged on the electron control layer, and a cover layer covering the display element layer, where any one among the hole control layer, the electron control layer, and the second electrode includes the deposition material.

In an embodiment, an angle defined by the base substrate and a side wall of the protrusion unit, which defines the pattern opening, may be about 90 degrees to about 150 degrees.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

It will be understood that when an element or layer is referred to as being "on", "connected to" or "coupled to" another element or layer, it can be directly on, connected or coupled to the other element or layer or intervening elements or layers may be present.

Like reference numerals in the drawings refer to like elements. In addition, in the drawings, the thickness and the ratio and the dimension of the element are exaggerated for effective description of the technical contents.

The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the disclosure. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the drawing figures.

Unless otherwise defined, all terms (including technical and scientific terms) used herein have the same meaning as commonly understood by one of ordinary skill in the art to which embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof. Hereinafter, embodiments of the invention will be described with reference to the accompanying drawings.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 1:
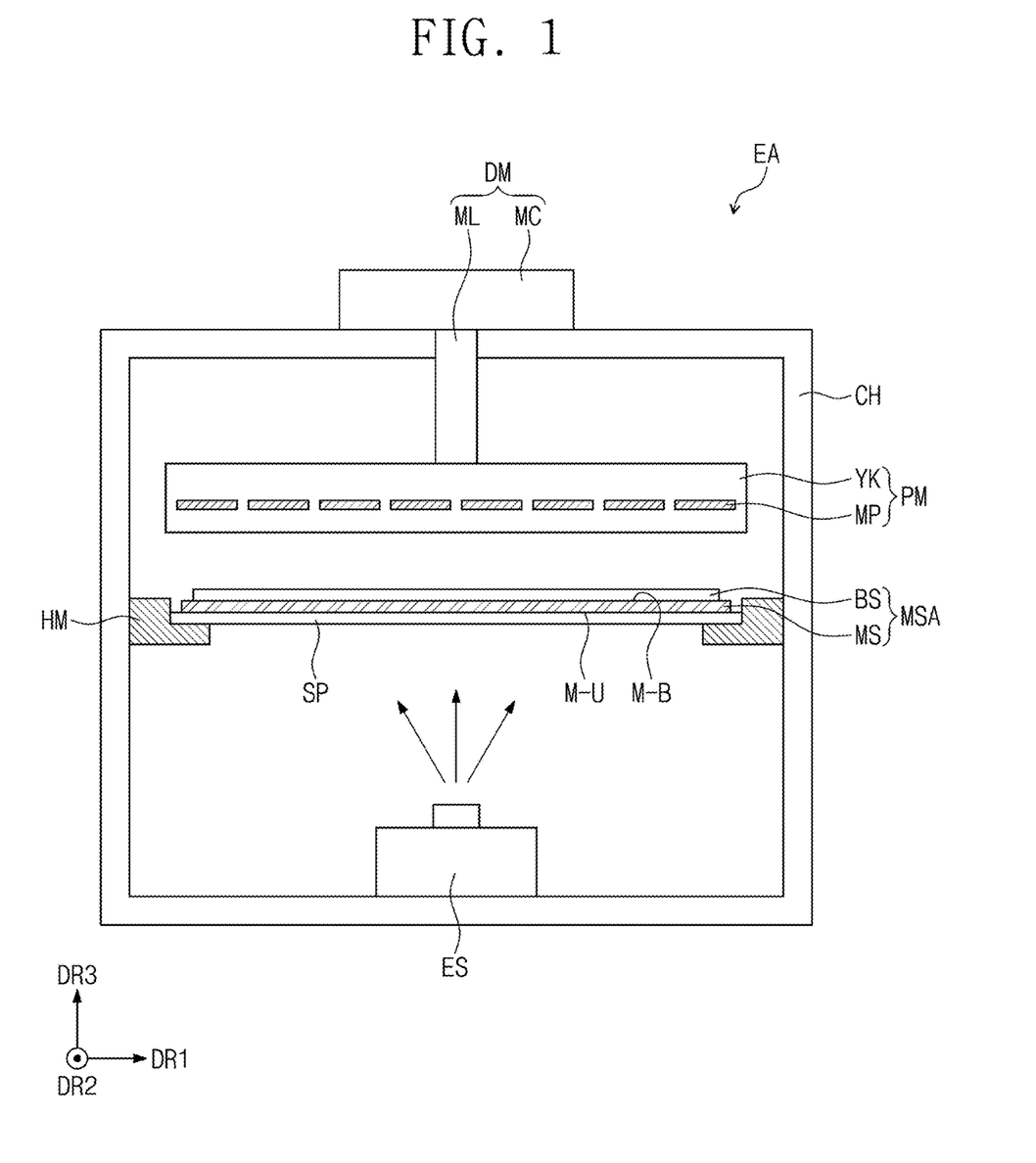
FIG. 1 is a plan view of an embodiment of a deposition apparatus according to the invention.
Figure 2A:
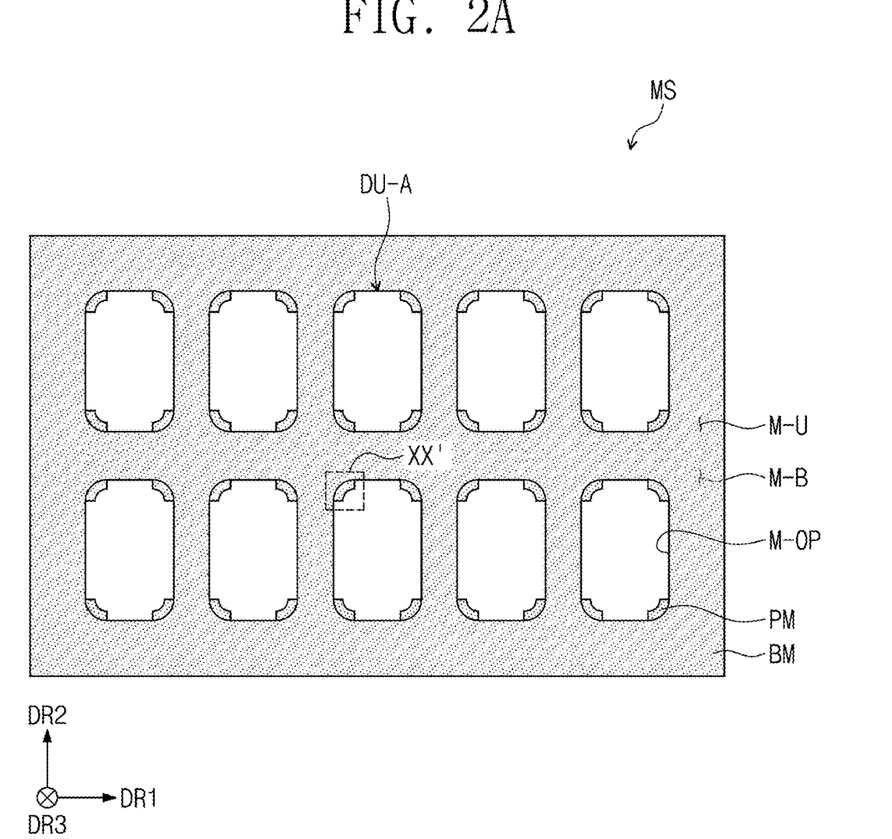
FIG. 2A is a plan view of an embodiment of a mask according to the invention.
Figure 2B:
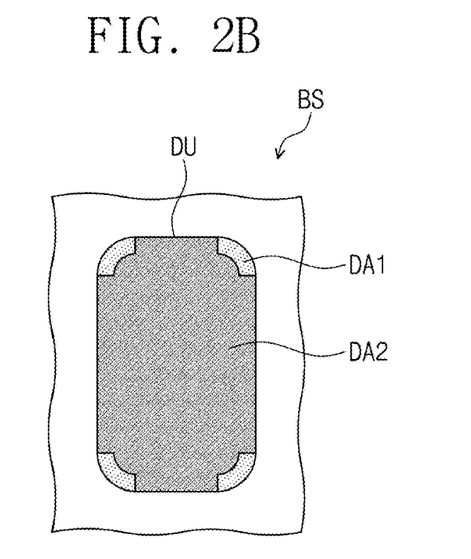
FIG. 2B is a plan view of an embodiment of a base substrate according to the invention.
Figure 3:
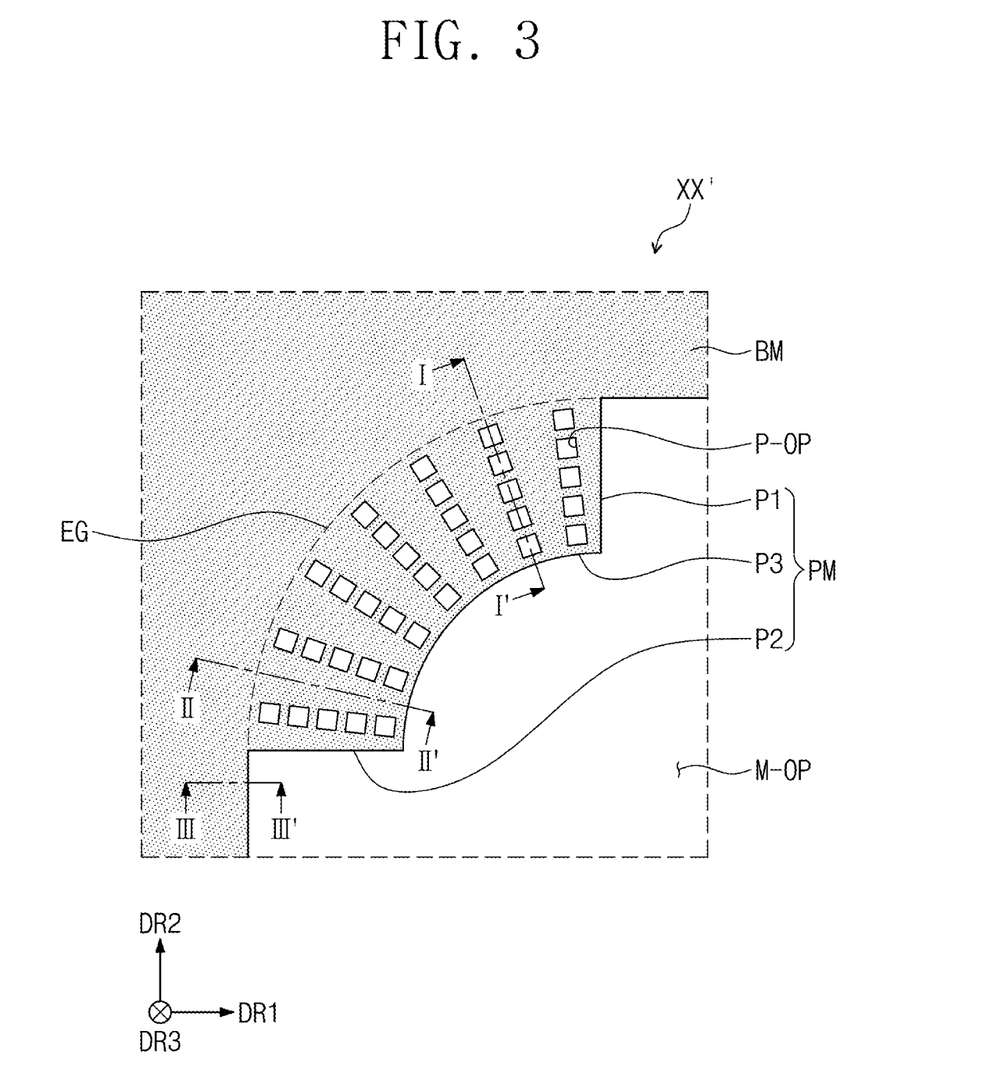
FIG. 3 is an enlarged view of area XX' illustrated in FIG. 2.
Figure 4:
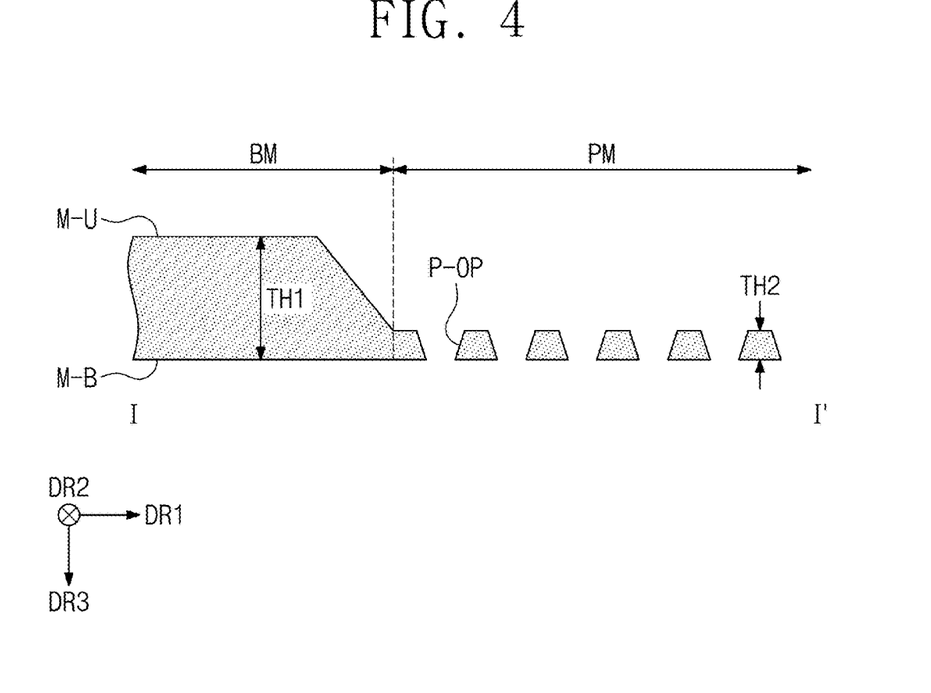
FIG. 4 is a cross-sectional view cut along line I-I' of FIG. 3.
Figure 5:
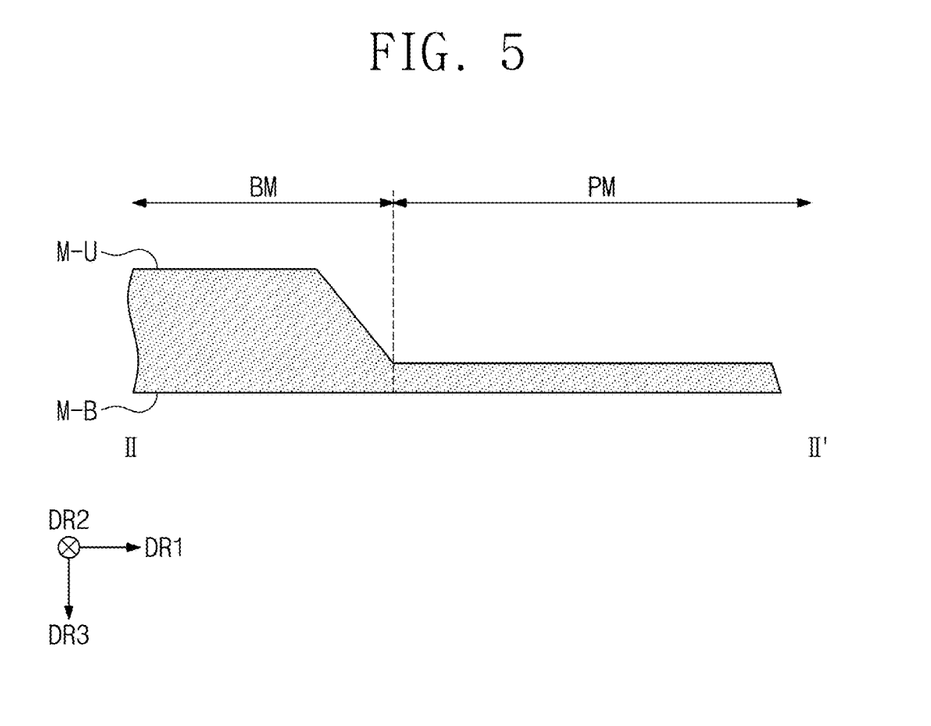
FIG. 5 is a cross-sectional view cut along II-IP shown in FIG. 3.
Figure 6:
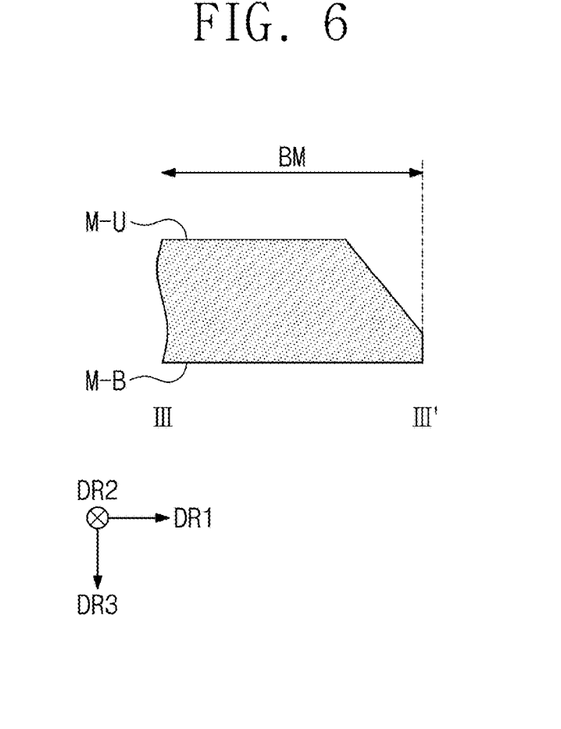
FIG. 6 is a cross-sectional view cut along shown in FIG. 3.
Figure 7:
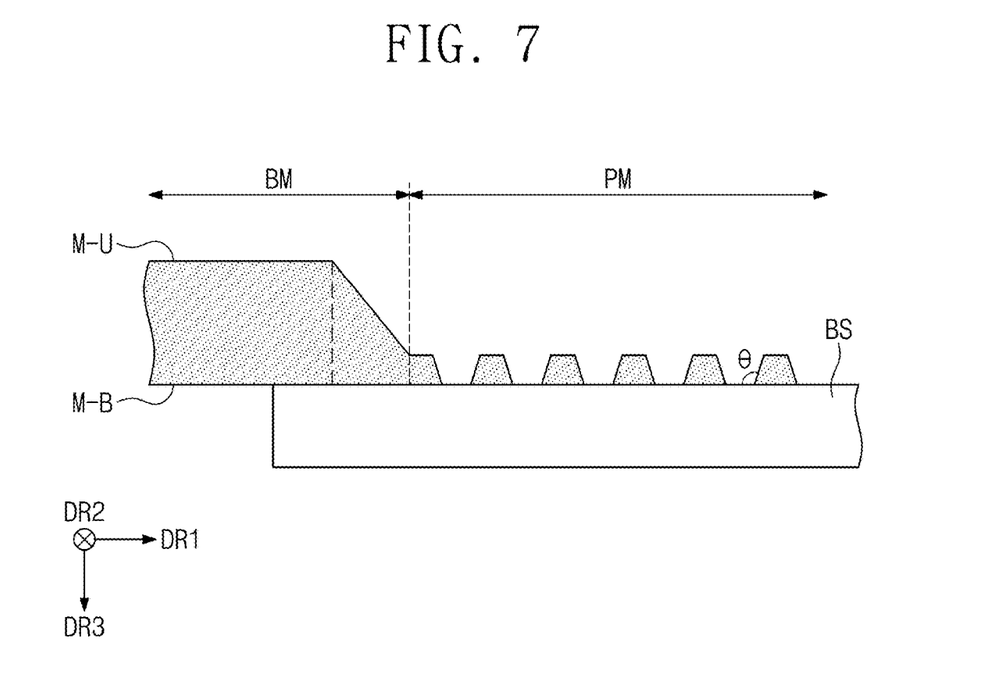
FIG. 7 is a cross-sectional view illustrating an embodiment of a portion of a mask assembly according to the invention.

FIG. 1 is a plan view of an embodiment of a deposition apparatus according to the invention. FIG. 2A is a plan view of an embodiment of a mask according to the invention. FIG. 2B is a plan view of an embodiment of a base substrate according to the invention. FIG. 3 is an enlarged view of area XX' illustrated in FIG. 2A. FIG. 4 is a cross-sectional view cut along line I-I' of FIG. 3. FIG. 5 is a cross-sectional view cut along II-IP shown in FIG. 3. FIG. 6 is a cross-sectional view cut along shown in FIG. 3. FIG. 7 is a cross-sectional view illustrating an embodiment of a portion of a mask assembly according to the invention.

A deposition apparatus EA according to the invention includes a chamber CH, a deposition source ES, a mounting unit HM, a mask assembly MSA, a pressing unit PM, and a transport unit DM. The mask assembly MSA may include a base substrate BS and a mask MS.

The chamber CH provides an internal space in which the deposition process may progress. In the internal space of the chamber CH, the deposition source ES, the mounting unit HM, the mask assembly MSA, the pressing unit PM, and a transport load ML of the transport unit DM may be arranged.

The deposition source ES provides a deposition material on the base substrate BS. In an embodiment, the deposition source ES may evaporate, towards the mask MS, at least one deposition material among an organic material, an inorganic material, and a conductive material, for example. Here, the deposition material may pass through openings that are defined by penetrating through the mask MS, and be deposited on the base substrate BS. In this case, the deposition source ES may be implemented in a method of heating and evaporating the deposition material at a high temperature.

Although not shown, the deposition apparatus EA may further include a transport means for moving the deposition source ES in horizontal directions DR1 and DR2.

The mounting unit HM may be arranged to the side walls of the chamber CH to support the mask assembly MSA. However, the invention is not limited thereto, and the shapes, positions, and number of the mounting units may not be limited to any particular embodiment as long as the mask assembly MSA is supported.

A frame SP is arranged on the mounting unit HM. The frame SP may be disposed between the mounting unit HM and the mask MS to prevent the mask MS from being drooped. Through the frame SP, a predetermined frame opening for exposing the openings defined in the mask MS may be defined. The mask MS may be attached to the edge of the frame SP. The mask MS may be welded and attached to the frame SP. The frame SP may include a metal. In an embodiment, for easy bonding with the mask MS, the frame SP may include a material having less thermal deformation upon being welded, for example.

The base substrate BS may be a mother substrate to be deposited. The base substrate BS may include deposition areas. The deposition areas may be defined as areas corresponding to the at least one opening defined in the mask MS. Accordingly, an area exposed by the mask MS may be defined as the deposition area, and an area covered by the mask MS may be defined as a non-deposition area. A plurality of deposition areas may be cut into individual display units in a subsequent process.

The pressing unit PM may include a magnetic force plate MP and a support plate YK. Although not shown, the pressing unit PM may further include a cooling plate disposed between the base substrate BS and the support plate YK.

The magnetic force plate MP may be arranged inside the support plate YK. However, the invention is not limited thereto, and the positions, shapes, and number of the magnetic force plates MP are not limited to any one as long as they are arranged on the mask MS to bond the mask MS and the base substrate BS by means of a magnetic force.

The magnetic force plate MP forms a magnetic force in a state where the base substrate BS adheres to the mask MS, to attract the mask MS including a metal by means of the attractive force. Accordingly, the bonding force is generated between the base substrate BS and the mask MS.

The magnetic force plate MP may prevent lifting occurring due to the difference in curvature between the base substrate BS and the mask MS, and prevent a shadowing phenomenon that indicates a deposition failure. The magnetic force plate MP may be provided as any one between a permanent magnet and an electromagnet.

The support plate YK may accommodate the magnetic force plate MP. The support plate YK is combined to the transport unit DM to cause the magnetic force plate MP to adhere to or be spaced apart from the base substrate BS.

The cooling plate (not shown) may be disposed between the base substrate BS and the support plate YK. The cooling plate provides a function for cooing the base substrate BS or the mask MS in order to be able to prevent the base substrate BS or the mask MS from being overheated in the deposition process. Accordingly, deformation of the base substrate may be prevented. A cooling line or the like through which cooling water or cooled air is injected may be provided inside the cooling plate.

The transport unit DM is connected to the pressing unit PM. The transport unit DM may include the transport load ML and a transport main body MC. The transport main body MC may transport the pressing unit PM in a third direction DR3, namely, an up/down direction, via the transport load ML.

In an embodiment, the transport main body MC may be arranged outside the chamber CH. The transport main body MC may be implemented as any one of a cylinder and a motor, for example. In an embodiment, when the transport main body MC is the cylinder, the transport load ML may be a piston, for example. When the transport main body MC is the motor, the transport load ML may be implemented as a ball screw axis capable of moving up/down according to the rotation of the motor. However, the invention is not limited thereto, and is not limited to any one as long as it is a device through which the transport unit DM may move the pressing unit PM.

Referring to FIGS. 2A and 2B, a deposition hole DU-A may be defined in the mask MS according to the invention. The mask MS according to the invention may be an open mask to be used in a process for depositing the whole surface of an individual deposition area DU included in the base substrate BS. The deposition hole DU-A may correspond to the deposition area DU.

The deposition hole DU-A may be provided in plural to be arranged in the first direction DR1 and the second direction DR2. In FIG. 2A, deposition holes of 2 rows×5 columns arranged in the first direction DR1 and the second direction DR2 are illustrated, but the number of deposition holes is not limited to any particular embodiment.

The mask MS may include a body unit BM and a protrusion unit PM. The body unit BM may mark off the boundaries of the individual deposition areas.

In the body unit BM, deposition openings M-OP, which penetrate through the front surface M-U and the rear surface M-B of the mask MS, are defined. In the invention, the deposition opening M-OP may be described as being defined in the body unit BM.

The protrusion unit PM may protrude along one direction from a corner of the body unit BM. The protrusion unit PM may be provided in plural, and thus a plurality of protrusion units may overlap in one deposition area DU. In an embodiment, the protrusion units may overlap in an area adjacent to the four corner portions of the deposition area DU, for example.

Each deposition area DU of the base substrate BS may be divided into a first area DA1 and a second area DA2 by the protrusion unit PM and the deposition opening M-OP defined in the mask MS.

The first area DA1 may be defined as an area overlapping the protrusion unit PM. Accordingly, the first area DA1 may be defined as an area covered by the protrusion unit PM. One area of the first area DA1 may be exposed by pattern openings P-OP (refer to FIG. 3) in an area overlapping the pattern openings P-OP defined in the protrusion unit PM, and the remaining area of the first area DA1 may be covered by the protrusion unit PM so as not to be exposed.

The second area DA2 may be defined as an area overlapping the deposition opening M-OP. The second area DA2 may surround at least a portion of the first area DA1. The second area DA2 may correspond to the remaining deposition area other than the pattern openings P-OP of the first area DA1 in the deposition area DU.

Referring to FIGS. 3 to 6, the protrusion unit PM in an embodiment of the invention may include a first part P1, a second part P2, and a third part P3. The first part P1 may protrude from a corner EG of the body unit BM in a predetermined direction. The second part P2 may be spaced apart from the first part P1 and protrude from the corner EG in a predetermined direction, and the third part P3 may be disposed between the first part P1 and the second part P2.

The corner EG may be defined as the boundary between the body unit BM and the protrusion unit PM. The corner EG may have a curvature. Accordingly, the corner EG in a plan view may include a curved line.

The third part P3 may be concave in a direction towards the corner EG in the deposition opening M-OP. The third part P3 may have the same curvature as the corner EG. However, the invention is not limited thereto, and the third part P3 may have a concave shape having a different curvature from the corner EG.

In the invention, the body unit BM and the protrusion unit PM may have a substantially integrated component, but will be described as having separate components for convenience of explanation. Accordingly, the corner EG of the body unit BM may be defined as a virtual line.

In the protrusion unit PM according to the invention, the pattern opening P-OP, which penetrates through the front surface M-U and the rear surface M-B of the mask MS, may be defined. The pattern opening P-OP may be provided in plural. In the illustrated embodiment, the plurality of pattern openings P-OP may be arranged in a direction from the corner EG of the body unit BM towards the deposition opening M-OP. The pattern openings P-OP arranged in the same direction may be defined as one pattern group, and the pattern group may be provided in plural to be arranged along the corner EG. In the illustrated embodiment, the pattern openings may be surrounded by the protrusion unit PM.

A first thickness TH1 of the body unit BM in the third direction DR3 may be greater than a second thickness TH2 of the protrusion unit PM in the third direction DR3. The protrusion unit PM may be provided by being irradiated with a plurality of laser beams on the front surface M-U of the body unit BM. Accordingly, one side surface connected to the protrusion unit PM in the body unit BM may be inclined. In an embodiment, the first thickness TH1 of the body unit BM may be about 100 micrometers (μm) to about 300 μm, and the second thickness TH2 of the protrusion unit PM may be about 10 μm to about 50 μm, for example.

When the thickness of the body unit BM is less than 100 μm, a drooping phenomenon may occur due to the weight of the mask MS itself. When the thickness of the body unit BM is greater than 300 μm, the thickness of the body unit BM itself is large, and thus, a shadow phenomenon may occur in which deposition materials provided from the deposition source ES are not deposited due to the thickness of the body unit BM itself.

When the thickness of the protrusion unit PM is less than 10 μm, the thickness of the protrusion unit PM itself is thin, and thus, the base substrate BS arranged on the rear surface M-B of the body unit BM may be spaced apart from the protrusion unit PM. When the thickness of the protrusion unit PM is greater than 50 μm, a shadow phenomenon may occur in which deposition is not performed due to the thickness of the body unit BM itself.

In the illustrated embodiment, the shape of a cross section of the protrusion unit PM may be trapezoidal. The longer side of the cross section of the trapezoid may contact the base substrate BS, and the shorter side may be spaced apart from the base substrate BS. Accordingly, the shape of the pattern opening P-OP on the cross section may be inverted trapezoidal.

According to the invention, the deposition materials provided from the deposition source ES may be deposited only on areas overlapping the pattern openings in the first area DA1 included in the deposition area DU of the base substrate BS, and the deposition materials may not be deposited on an area that does not overlap the pattern openings and is covered by the protrusion unit PM in the first area DA1.

Referring to FIG. 7, an angle θ defined by the base substrate BS and a sidewall of the protrusion unit PM, which defines the pattern opening P-OP, may be about 90 degrees to about 150 degrees.

When the angle θ is less than 90 degrees, the deposition materials do not pass through the pattern opening P-OP to cause a deposition failure. When the angle θ is greater than 150 degrees, the protrusion unit PM is thin and is not fixed to the base substrate BS to cause a drooping phenomenon.

The angle θ defined by the base substrate BS and the sidewall of the protrusion unit PM, which defines the pattern opening P-OP, may have various incident angles at a level of not being influenced by a deposition incident angle.

Typically, when the corner portion of the display panel on which an image is provided has a curved shape, the corner portion may be cut with a laser beam to implement the curved shape. Here, damage may be added to the components of the display panel due to irradiation with the laser beam, and thus, the display panel with reduced reliability may be provided.

For a display panel for which a deposition process using a mask according to the invention is employed, in a single process, a component desiring deposition of the whole surface may be deposited while a non-deposition area is provided at a corner portion. Accordingly, as the non-deposition area is removed in a process for removing the corner of the display panel with a laser, damage to components included in the display panel may be minimized. Accordingly, a display device of improved reliability may be provided.

Figure 8:
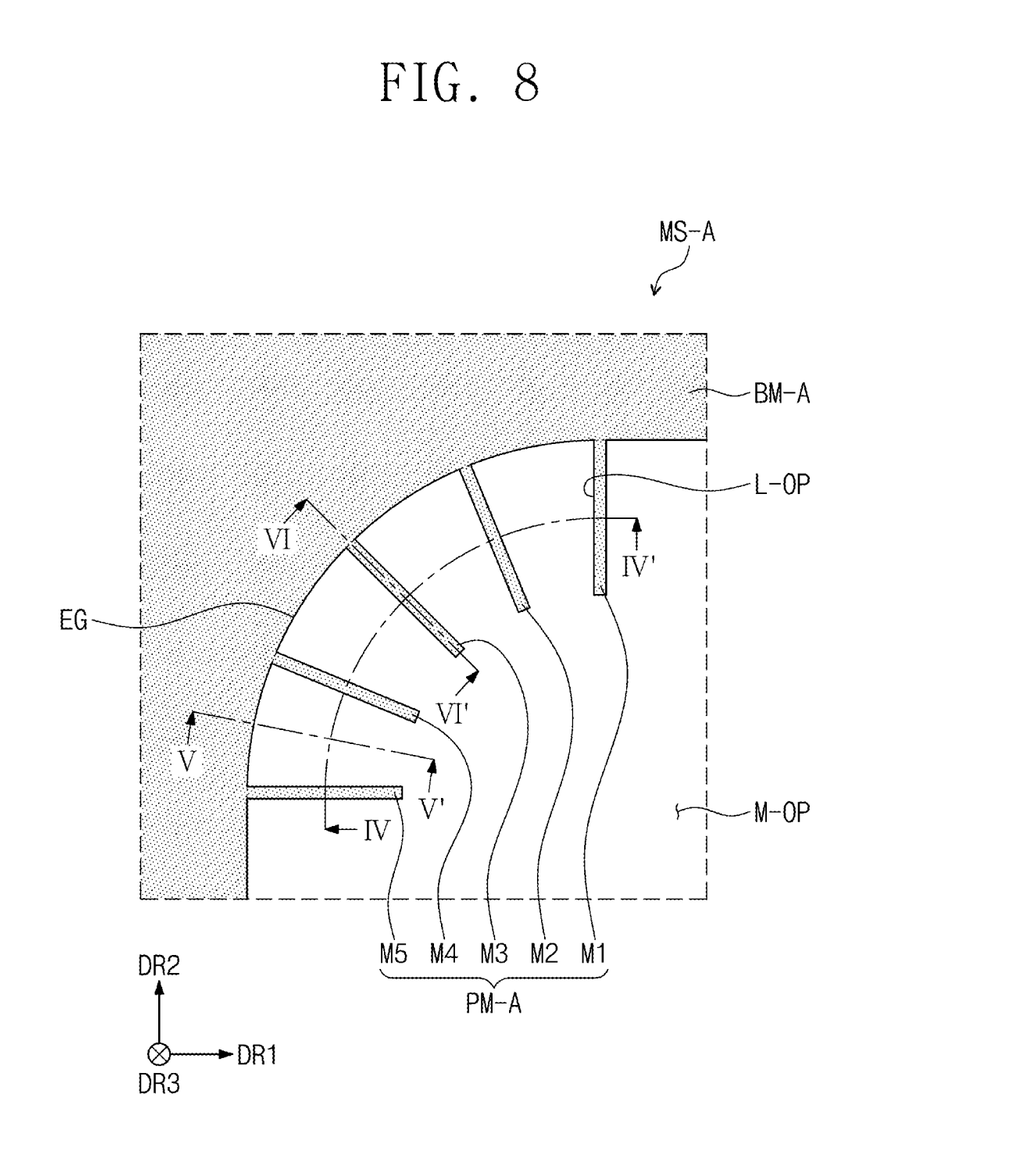
FIG. 8 is an enlarged plan view of an embodiment of one area of a mask according to the invention.
Figure 9:
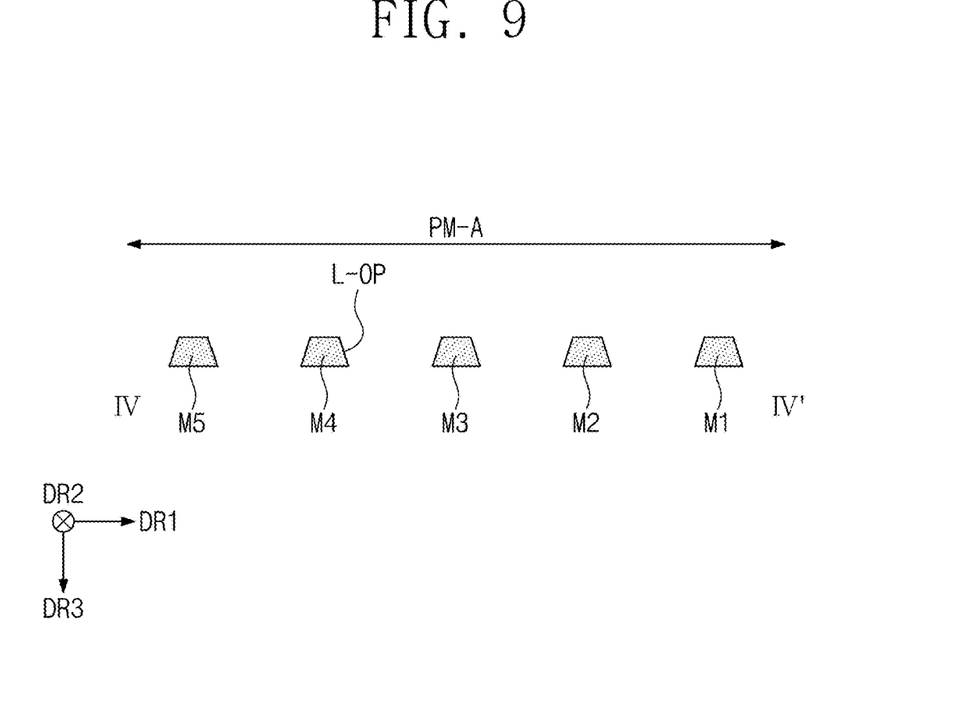
FIG. 9 is a cross-sectional view cut along IV-IV' shown in FIG. 8.
Figure 10:
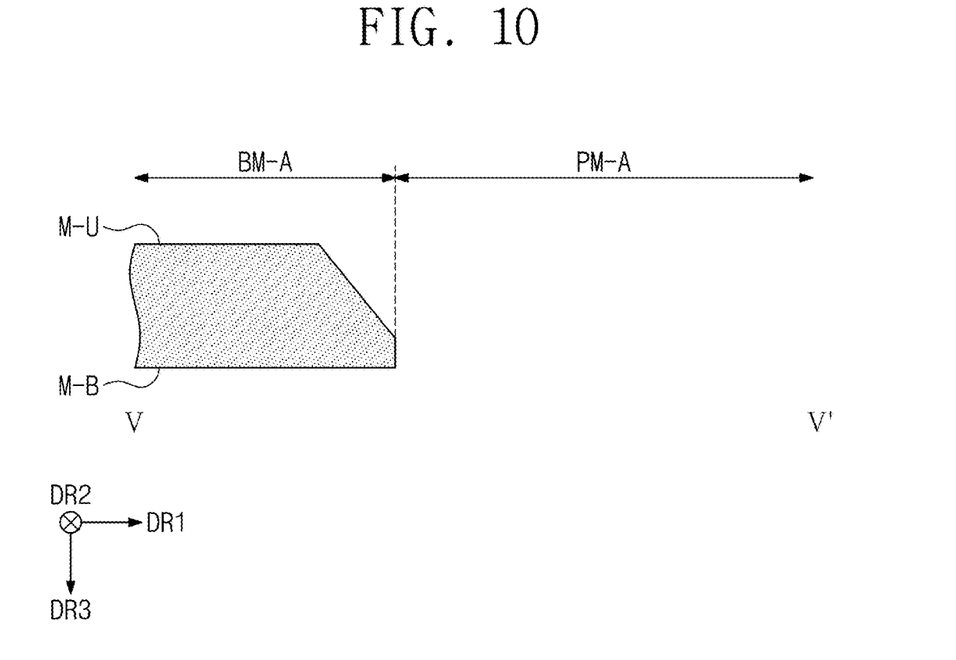
FIG. 10 is a cross-sectional view cut along V-V' shown in FIG. 8.
Figure 11:
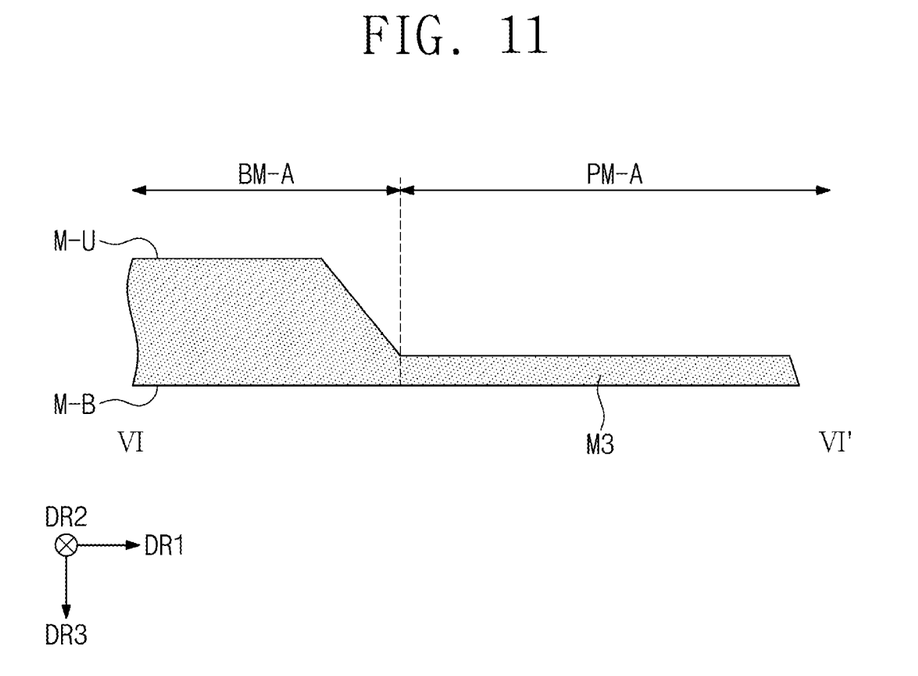
FIG. 11 is a cross-sectional view cut along VI-VI' shown in FIG. 8.

FIG. 8 is an enlarged plan view of an embodiment of one area of a mask according to the invention. FIG. 9 is a cross-sectional view cut along IV-IV' shown in FIG. 8. FIG. 10 is a cross-sectional view cut along V-V' shown in FIG. 8. FIG. 11 is a cross-sectional view cut along VI-VI' shown in FIG. 8. For the same/similar configuration as FIGS. 1 to 7, the same/similar reference numerals are used and their overlapping description will be omitted.

Referring to FIG. 8, a mask MS-A in the illustrated embodiment may include a body unit BM-A, and a protrusion unit PM-A. The protrusion unit PM-A may include a plurality of partition walls M1 to M5. The base substrate BS overlapping the partition walls M1 to M5 may be a non-deposition area on which the deposition material is not deposited.

The partition walls M1 to M5 may be arranged separately from each other to expose a portion of the corner EG. The partition walls M1 to M5 may extend from the corner EG in a direction towards the deposition opening M-OP. The partition walls M1 to M5 may have a trapezoidal shape on the cross section.

The thickness of the body unit BM-A in the third direction DR3 may be larger than those of the partition walls M1 to M5 in the third direction DR3.

In the illustrated embodiment, the pattern opening L-OP and the deposition opening M-OP may have a unitary shape. In other words, the partition walls M1 to M5 may be provided by removing a portion of the third part P3 described with reference to FIG. 3.

The display panel provided by means of the mask MS-A in the illustrated embodiment through the deposition process may make a corner of the display panel curved by removing the non-deposition area overlapping the partition walls M1 to M5.

Figure 12:
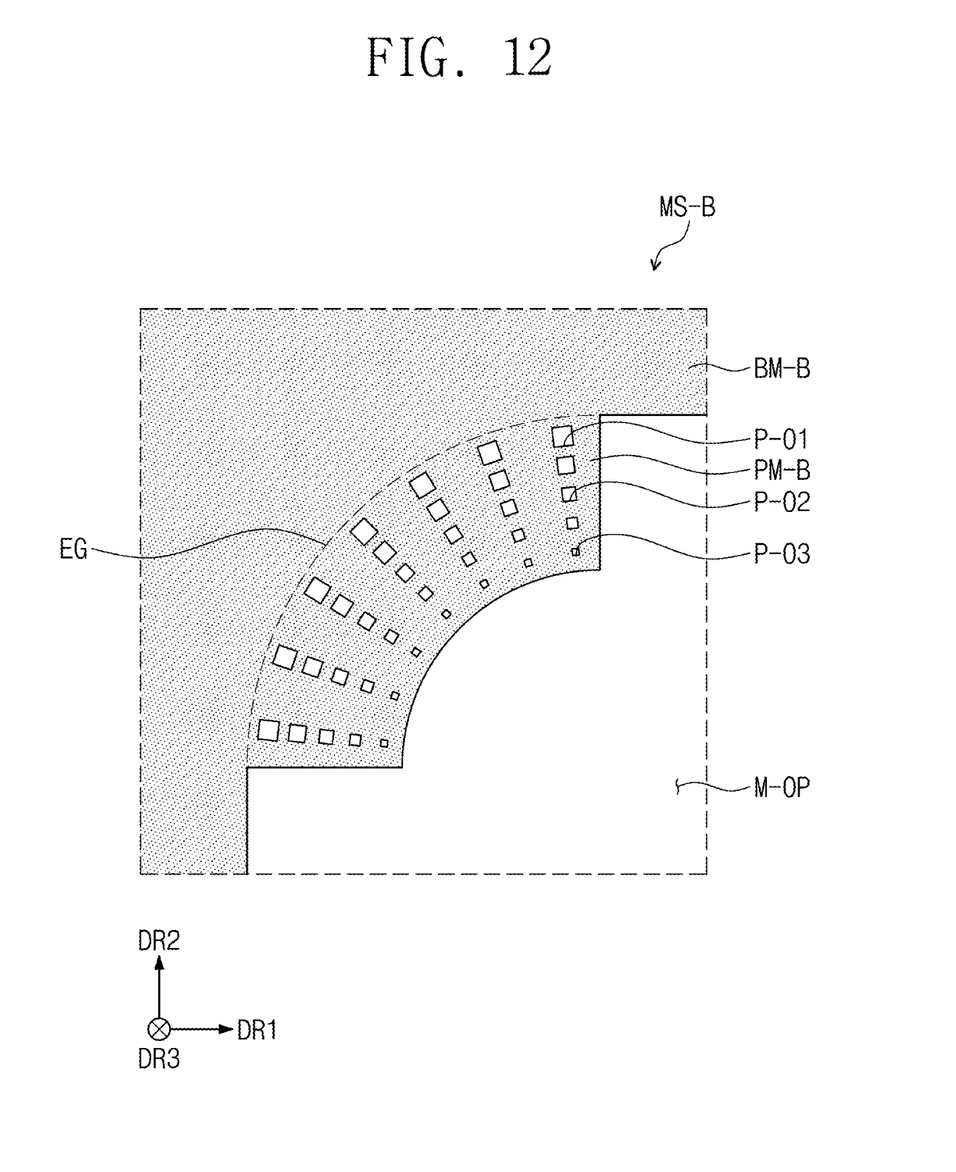
FIG. 12 is an enlarged plan view of an embodiment of one area of a mask according to the invention.
Figure 13:
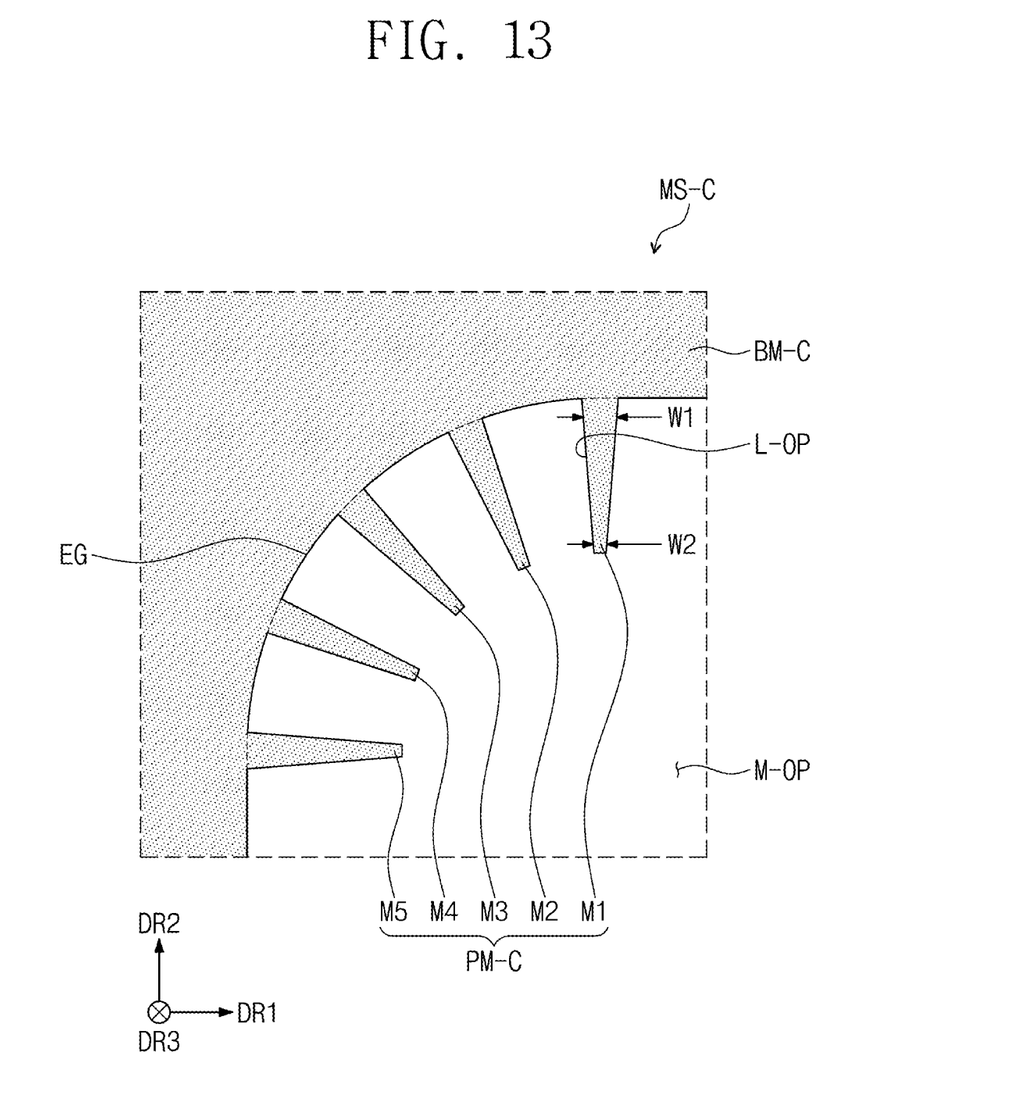
FIG. 13 is an enlarged plan view of an embodiment of one area of a mask according to the invention.

FIG. 12 is an enlarged plan view of an embodiment of one area of a mask according to the invention. FIG. 13 is an enlarged plan view of an embodiment of one area of a mask according to the invention. For the same/similar configuration as FIGS. 11 and 12, the same/similar reference numerals are used and their overlapping description will be omitted.

Referring to FIG. 12, a mask MS-B in the illustrated embodiment may include a body unit BM-B and a protrusion unit PM-B. A plurality of pattern openings P-01, P-02, and P-03 may be defined in the protrusion unit PM-B.

The pattern openings P-01, P-02, and P-03 may be defined by penetrating through the front surface M-U and the rear surface M-B of the mask MS-B. The pattern openings P-01, P-02, and P-03 may be arranged in a direction from the corner EG of the body unit BM-B towards the deposition opening M-OP. The pattern openings arranged in the same direction may be defined as one pattern group, and the pattern group may be provided in plural to be arranged along the corner EG. In the illustrated embodiment, the pattern openings may be surrounded by the protrusion unit PM-B.

The pattern openings P-01, P-02, and P-03 defined in the same pattern group in the illustrated embodiment may have different areas. In an embodiment, the areas of the pattern openings P-01, P-02, and P-03 may be gradually reduced in a direction from the corner EG of the body unit BM-B towards the deposition opening M-OP, for example. However, the invention is not limited thereto or not limited to any particular embodiment. The areas of the pattern openings P-01, P-02, and P-03 may randomly vary, or gradually increase in a direction from the corner EG of the body unit BM-B towards the deposition opening M-OP.

Referring to FIG. 13, a mask MS-C in the illustrated embodiment may include a body unit BM-C and a protrusion unit PM-C. The protrusion unit PM-C may include a plurality of partition walls M1 to M5. The base substrate BS overlapping the partition walls M1 to M5 may be a non-deposition area on which the deposition material is not deposited.

The partition walls M1 to M5 may be arranged separately from each other to expose a portion of the corner EG. The partition walls M1 to M5 may extend from the corner EG towards the deposition opening M-OP.

The widths of the partition walls M1 to M5 may vary in a direction perpendicular to a direction in which the partition walls M1 to M5 extend. In an embodiment, a first width W1 of the first partition wall M1 adjacent to the body unit BM-C may be greater than a second width W2 of the first partition wall M1 distant from the body unit BM-C, for example.

Figure 14:
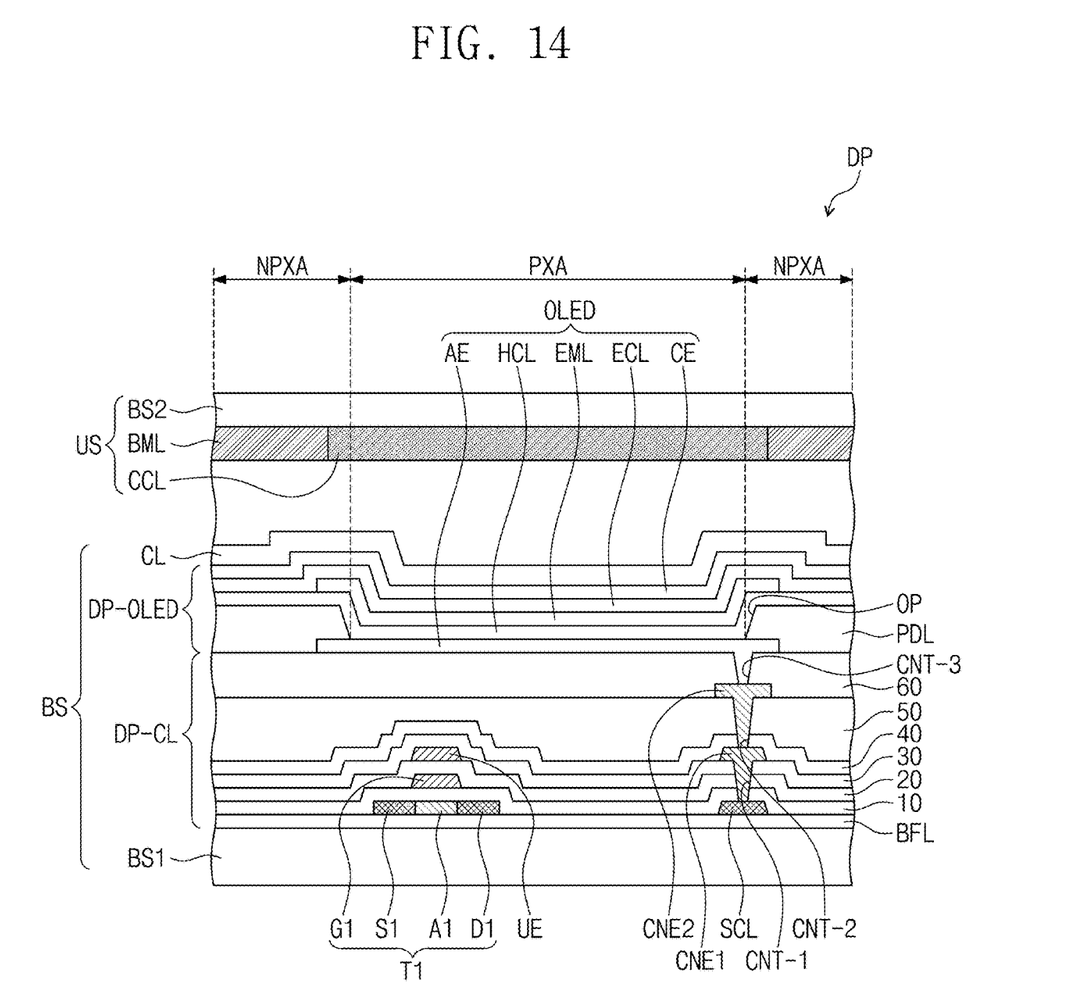
FIG. 14 is a cross-sectional view of an embodiment of a display panel according to the invention.

FIG. 14 is a cross-sectional view of an embodiment of a display panel according to the invention. At least some of corners included in a display panel DP to be described in the illustrated embodiment may have curved shapes. In addition, the display panel DP of the curved shape may be provided through a process for removing the non-deposition area in the first area DA1 described with reference to FIG. 2B.

Some of components of the display panel DP shown in FIG. 14 may be components provided by a deposition apparatus including the mask described with reference to FIGS. 1 to 13.

A gradation display layer of the display panel DP according to the invention may include an organic light emitting layer. Accordingly, the display panel DP may be an organic light emitting display panel.

The organic light emitting display panel may include a base substrate BS and an encapsulation substrate US. The base substrate BS includes a first base substrate BS1, a circuit element layer DP-CL arranged on the first base substrate BS1, a display element layer DP-OLED arranged on the circuit element layer DP-CL, and a cover layer CL arranged on the display element layer DP-OLED. The encapsulation substrate US may include a second base layer BS2, a black matrix layer BML arranged on the second base layer BS2, and a color control layer CCL.

The circuit element layer DP-CL may include a plurality of insulation layers, a semiconductor pattern, a conductive pattern, a signal line, and the like. The insulation layers, the semiconductor layer, and the conductive layer may be provided through manners of coating, deposition, and the like. Then, the insulation layers, the semiconductor layer, and the conductive layer may be selectively patterned in a photolithography manner. Through such manners, semiconductor patterns, conductive patterns, signal lines, and the like are provided which are included in the circuit element layer DP-CL and the display element layer DP-OLED.

The first base substrate BS1 may include a synthetic resin film. Moreover, the base layer BS1 may include a glass substrate, a metal substrate, or an organic/inorganic composite material substrate, etc.

The buffer layer BFL may be arranged on the first base substrate BS1. The buffer layer BFL may enhance the bonding force between the first base substrate BS1 and the semiconductor pattern. The buffer layer BFL may include silicon oxide layers and silicon nitride layers. The silicon oxide layers and the silicon nitride layers may be alternately laminated.

The semiconductor pattern may be arranged on the buffer layer BFL. The semiconductor pattern may include polysilicon. However, the invention is not limited thereto, and the semiconductor pattern may include amorphous silicon or metal oxide.

The semiconductor pattern may include a doped area or a non-doped area. The doped area may be doped with an n-type dopant or a p-type dopant. A p-type transistor includes a doped area doped with a p-type dopant.

The doped area has larger conductivity than the non-doped area, and substantially plays a role of an electrode or a signal line. The non-doped area substantially corresponds to an active area (or channel) of a transistor. In other words, a portion of the semiconductor pattern may be the active area of the transistor, another portion may be a source or a drain, and another portion may be a connection electrode or a connection signal line.

The transistor T1 is arranged on the buffer layer BFL. A source S1, an active area A1, and a drain D1 of the transistor T1 are provided from the semiconductor pattern. In FIG. 14, a portion of a signal connection line SCL provided from the semiconductor pattern is illustrated. Although not illustrated separately, the signal connection line SCL may be connected to the drain D1 of the transistor T1 in a plan view.

A first insulation layer 10 to a sixth insulation layer 60 are arranged on the buffer layer BFL. The first insulation layer 10 to the sixth insulation layer 60 may be inorganic layers or organic layers. A gate G1 is arranged on the first insulation layer 10. An upper electrode UE may be arranged on the second insulation layer 20. A first connection electrode CNE1 may be arranged on the third insulation layer 30. The first connection electrode CNE1 may be connected to the signal connection line SCL through a contact hole CNT-1 penetrating through the first to third insulation layers 10 to 30. A second connection electrode CNE2 may be arranged on the fifth insulation layer 50. The second connection electrode CNE2 may be connected to the first connection electrode CNE1 through a contact hole CNT-2 penetrating through the fourth insulation layer 40 and the fifth insulation layer 50.

A light emitting element OLED is arranged on the sixth insulation layer 60. A first electrode AE is arranged on the sixth insulation layer 60. The first electrode AE is connected to the second output electrode CNE2 through a contact hole CNT-3 penetrating the sixth insulation layer 60.

The display element layer DP-OLED includes a light emitting element OLED and a pixel definition layer PDL. In an embodiment, the pixel definition layer PDL may be an organic layer, for example. The light emitting element OLED includes a first electrode AE, a hole control layer HCL, a light emitting layer EML, an electron control layer ECL, and a second electrode CE.

The pixel definition layer PDL is arranged on the sixth insulation layer 60. An opening OP (hereinafter, display opening) is defined in the pixel definition layer PDL. The display opening OP exposes at least a portion of the first electrode AE. In an embodiment of the invention, the pixel definition layer PDL may have a black color. The pixel definition layer PDL may include a black coloring agent. The pixel definition layer PDL may include a black dye or a black pigment mixed in a base resin.

In FIG. 14, a light emitting area PXA and a non-light emitting area NPXA adjacent to the light emitting area PXA are illustrated. The light emitting area PXA may be defined to substantially correspond to an area of the first electrode AE exposed by the display opening OP.

The hole control layer HCL may be commonly arranged in the light emitting area PXA and the non-light emitting area NPXA. Accordingly, the hole control layer HCL may be deposited over the whole surface of the first base substrate BS1. The hole control layer HCL may include a hole transport layer, and further include a hole injection layer.

A light emitting layer EML is disposed on the hole control layer HCL. The light emitting layer EML may be arranged on an area corresponding to the display opening OP. The light emitting layer EML is illustrated to be patterned and overlap the display opening OP, but the invention is not limited thereto. The light emitting layer EML may be commonly arranged in the light emitting area PXA and the non-light emitting area NPXA. Accordingly, the light emitting layer EML may be deposited over the whole surface of the first base substrate BS1.

An electron control layer ECL is disposed on the light emitting layer EML. The electron control layer ECL may include an electron transport layer, and further include an electron injection layer.

A second electrode CE is disposed on the electron control layer ECL. The second electrode CE may be commonly arranged in the light emitting area PXA and the non-light emitting area NPXA. Accordingly, the second electrode CE may be deposited over the whole surface of the first base substrate BS1.

The cover layer CL is disposed on the second electrode CE. The cover layer CL may include a plurality of thin films. As the illustrated embodiment, the cover layer CL may include a capping layer and a thin film encapsulation layer.

The second base layer BS2 is arranged separately from the cover layer CL. The second base layer BS2 may be any one among a glass substrate, a plastic substrate, and a substrate including polyimide ("PI").

The color control layer CCL may transmit first color light, or convert the first color light to second color light or third color light according to a color of the light provided by the light emitting element OLED. The color control layer CCL may include a quantum dot. Here, the first color light may be blue light.

The black matrix layer BML may overlap the non-light emitting area NPXA. The black matrix layer BML may have a black color. The black matrix layer BML may include a material absorbing light, and is not limited to any particular type.

The mask MS of the invention may be used for forming a component to be deposited over the whole surface of the first base substrate BS1 among components included in the light emitting element OLED.

However, the invention is not limited thereto. A component, which is to be provided through the deposition process, among components provided over the base layers BS1 and BS2 of the display panel DP may be provided by the deposition apparatus EA of the invention, and is not limited to any particular embodiment.

For a display panel for which the deposition process progresses using the mask according to the invention, in a single process, a component desiring deposition of the whole surface may be deposited while a non-deposition area is provided at a corner portion. Accordingly, as the non-deposition area is removed in a process for removing the corner of the display panel with a laser, damage to components included in the display panel may be minimized. Accordingly, a display device of improved reliability may be provided.

While this invention has been described with reference to embodiments thereof, it will be clear to those of ordinary skill in the art to which the invention pertains that various changes and modifications may be made to the described embodiments without departing from the spirit and technical area of the invention as defined in the appended claims and their equivalents.

Thus, the scope of the invention shall not be restricted or limited by the foregoing description, but be determined by the broadest permissible interpretation of the following claims.

What is claimed is:

1. A mask comprising:
    a body unit including a deposition area through which a deposition opening is defined; and
    protrusion units which only protrude from corners of the deposition area of the body unit, respectively, so that adjacent protrusion units of the protrusion units are spaced apart from each other and directly face to each other,
    wherein pattern openings are defined in each of the protrusion units, and
    a thickness of the body unit is greater than a thickness of a protrusion unit of the protrusion units.

2. The mask of claim 1, wherein the protrusion unit comprises:
    a first part protruding from a corner of the corners of the deposition area of the body unit;
    a second part spaced apart from the first part and protruding from the corner of the deposition area of the body unit; and
    a third part disposed between the first part and the second part.

3. The mask of claim 2, wherein the corner has a curvature, and the third part is concave from the deposition opening towards the corner of the deposition area of the body unit.

4. The mask of claim 1, wherein the pattern openings are arranged from a corner of the corners of the deposition area of the body unit towards a center of the deposition opening.

5. The mask of claim 4, wherein the pattern openings are surrounded by the protrusion unit.

6. The mask of claim 4, wherein the pattern openings have different areas from each other.

7. The mask of claim 1, wherein the protrusion unit comprises partition walls,
wherein the partition walls exposes a portion of a corner of the corners of the deposition area of the body unit, is arranged separately from each other, and extends from the corner of the deposition area of the body unit towards the deposition opening.

8. The mask of claim 1, wherein, in a direction from a corner of the corners of the deposition area of the body unit towards a center of the deposition opening, a width of at least one among the protrusion units varies in a perpendicular direction to the direction.

9. The mask of claim 1, wherein a thickness of the body unit is about 100 micrometers to about 300 micrometers.

10. The mask of claim 1, wherein a thickness of the protrusion unit is about 10 micrometers to about 50 micrometers.

11. A deposition apparatus comprising:
a chamber;
a mask arranged inside the chamber;
a base substrate arranged on the mask, and comprising a first area and a second area surrounding at least a portion of the first area; and
a deposition source which provides a deposition material to the base substrate,
wherein the mask comprises:
a body unit including a deposition area in which a deposition opening exposing the second area is defined; and
protrusion units which only protrudes from corners of the deposition area of the body unit, respectively, so that adjacent protrusion units of the protrusion units are spaced apart from each other and directly face to each other, and cover a remaining portion of the first area,
wherein the first area is adjacent to a corner of the corners,
pattern openings exposing a portion of the first area are defined in each of the protrusion units, and
a thickness of the body unit is greater than a thickness of a protrusion unit of the protrusion units.

12. The deposition apparatus of claim 11, wherein the protrusion unit comprises:
a first part protruding from the corner of the deposition area of the body unit;
a second part spaced apart from the first part and protruding from the corner of the deposition area of the body unit; and
a third part disposed between the first part and the second part.

13. The deposition apparatus of claim 12, wherein the corner of the deposition area of the body unit has a curvature, and the third part is concave from the deposition opening towards the corner of the deposition area of the body unit.

14. The deposition apparatus of claim 11, wherein the pattern openings are arranged from the corner of the deposition area of the body unit towards a center of the deposition opening.

15. The deposition apparatus of claim 14, wherein the pattern openings are surrounded by the protrusion unit.

16. The deposition apparatus of claim 14, wherein the pattern openings have different areas from each other.

17. The deposition apparatus of claim 11, wherein the protrusion unit comprises partition walls,
wherein the partition walls exposes a portion of the corner of the deposition area of the body unit, is arranged separately from each other, and extends from the corner of the deposition area of the body unit towards the deposition opening.

18. The deposition apparatus of claim 11, wherein, in a direction from the corner of the deposition area of the body unit towards the deposition opening, a width of at least one among the protrusion units varies in a perpendicular direction to the direction.

19. The deposition apparatus of claim 11, wherein the base substrate comprises:
a base layer;
a circuit element layer arranged on the base layer and comprising a transistor comprising a plurality of electrodes;
a display element layer comprising a first electrode connected to the transistor, a hole control layer arranged on the first electrode, a light emitting layer arranged on the hole control layer, an electron control layer arranged on the light emitting layer, and a second electrode arranged on the electron control layer; and
a cover layer covering the display element layer,
wherein any one among the hole control layer, the electron control layer, and the second electrode comprises the deposition material.

20. The deposition apparatus of claim 11, wherein an angle defined by the base substrate and a side wall of the protrusion unit, which defines a pattern opening of the pattern openings, is about 90 degrees to about 150 degrees.

* * * * *